US009362888B2

(12) United States Patent
Chappaz

(10) Patent No.: US 9,362,888 B2
(45) Date of Patent: Jun. 7, 2016

(54) DEVICES AND METHODS FOR CONVERTING DIGITAL SIGNALS

(71) Applicant: QUALCOMM Technologies International, Ltd., Cambridge (GB)

(72) Inventor: David Chappaz, Milton (GB)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 0 days.

(21) Appl. No.: 14/471,554

(22) Filed: Aug. 28, 2014

(65) Prior Publication Data

US 2016/0065177 A1     Mar. 3, 2016

(51) Int. Cl.
| | |
|---|---|
| *H03F 3/217* | (2006.01) |
| *H03F 3/45* | (2006.01) |
| *H03H 11/04* | (2006.01) |
| *H03K 7/08* | (2006.01) |

(52) U.S. Cl.
CPC ........... *H03H 11/0405* (2013.01); *H03F 3/217* (2013.01); *H03F 3/2175* (2013.01); *H03K 7/08* (2013.01)

(58) Field of Classification Search
CPC ............... H03F 3/2175; H03F 3/217
USPC ................... 330/260, 251; 341/143
See application file for complete search history.

(56) References Cited

U.S. PATENT DOCUMENTS

| | | | |
|---|---|---|---|
| 2003/0122692 A1 | 7/2003 | Roeckner et al. | |
| 2006/0091945 A1* | 5/2006 | Wegner | ........................... 330/10 |
| 2009/0096649 A1 | 4/2009 | Ferri | |
| 2011/0102223 A1* | 5/2011 | Kinyua et al. | ................. 341/143 |
| 2015/0180430 A1* | 6/2015 | Wang et al. | ............. H03F 3/217 |

FOREIGN PATENT DOCUMENTS

| | | |
|---|---|---|
| EP | 0982865 A2 | 3/2000 |
| JP | 2006121139 A | 5/2006 |

OTHER PUBLICATIONS

International Search Report and Written Opinion—PCT/US2015/047560—ISA/EPO—Dec. 10, 2015.
GB Search Report Issued in related GB Application No. 1502314.6, dated Feb. 24, 2016, 4 Pages.

* cited by examiner

*Primary Examiner* — Arnold Kinkead
(74) *Attorney, Agent, or Firm* — Procopio, Cory, Hargreaves & Savitch LLP

(57) ABSTRACT

A signal converter directly converts pulse-density-modulated (PDM) signals into pulse-width-modulated (PWM) signals. A noise-shaping loop architecture can be configured to apply a signal transfer function having a low-pass filter effect, and a noise transfer function having a high-pass filter effect. Decimation and interpolation can ensure that the noise-shaping loop architecture operates at a first sampling frequency, while the PWM modulator operates at a second, higher sampling frequency.

21 Claims, 5 Drawing Sheets

DEVICES AND METHODS FOR CONVERTING DIGITAL SIGNALS

TECHNICAL FIELD

The present invention relates to devices and methods for converting digital signals, and particularly to devices and methods for converting pulse-density-modulated (PDM) into pulse-width-modulated (PWM) signals.

BACKGROUND

Class-D amplifiers are becoming increasingly popular due to their high efficiency (typically 90% or higher) and compact size. Such amplifiers are based on the PWM principle, and require input PWM signals to operate.

FIG. 1 is a schematic diagram of a device 10 for generating PWM signals.

A signal X is received at an input. The input signal X is to be converted into a PWM signal, but can take any form itself. In the illustrated example, X is a digital signal and has a high number of bits, such as 24. The input signal X is fed to an add/subtract unit 12, where it is combined with a feedback signal provided by a noise-shaping loop 18. The signal output from the add/subtract unit 12 is thus compensated for any error in the output of the device 10.

The compensated signal is passed to a loop filter 14, which can be implemented in many different ways. In one example, the loop filter 14 comprises one or more integrators, and these integrators can be arranged in one or multiple stages. The output of the loop filter 14 is provided to a PWM modulator 16. In FIG. 1, this is implemented by a simple comparator, although more complicated arrangements are also possible. The comparator compares the output of the loop filter 14 with a carrier signal, and outputs a 1-bit signal indicative of the comparison. The carrier signal can be a triangular wave signal or a saw-tooth signal, for example. Provided the output of the loop filter 14 varies at a lower rate than the carrier signal (which will be the case for all practical realisations), the output of the comparator switches only twice for each switching period of the carrier signal, thus generating a pulse of variable width in each period. This PWM signal Y is provided as an output of the device 10.

The PWM modulator 16 introduces a source of noise due to the quantization of the signal; for the device 10 to be used in an audio application, such noise has to be shaped so as not to fall within frequencies which can be heard by users. A noise-shaping feedback loop 18 is thus coupled around the PWM modulator 16, schematically illustrated between an output of the PWM modulator 16 and the add/subtract unit 12. Those skilled in the art will appreciate that the feedback signal Y may be multiplied by one or more coefficients and also combined with the input signal at one or more places in the processing chain in order to control precisely the effect of the noise-shaping loop 18.

The quality in the output signal Y can be increased by increasing the frequency $f_w$ with which the PWM modulator 16 is clocked. That is, for each period $1/f_w$, the PWM modulator 16 compares its two input signals and generates an output signal. In a typical audio application, for example, $f_w$ may be 40 MHz or higher, while the frequency of the carrier signal may be 200 kHz or higher. Typically, therefore, the PWM modulator 16 is clocked at a frequency $f_w$ which is approximately two orders of magnitude higher than the carrier frequency.

FIG. 2 is a schematic graph showing the waveforms of various signals in the PWM modulating device 10. The output of the loop filter 14 is illustrated by the curved solid line 200. This is illustrated as an analogue signal, but in practice also represents a digital signal with a high number of bits (e.g. 24, as in FIG. 1). The output of the loop filter 14 is illustrated as a continuous-time signal, but in practice may also represent a discrete-time signal with sampling frequency $f_w$. The carrier signal is illustrated by the dashed line 202, and in this case is a rising sawtooth signal. As with the output of the loop filter 200, the carrier signal 202 may also be quantised in amplitude and in continuous-time or discrete-time with sampling frequency $f_w$. The vertical dotted lines illustrate the sampling points of the PWM modulator 16. The output of the PWM modulator 16 (i.e. the PWM signal) is illustrated by the single-bit signal 204. Note that the amplitude of the PWM signal is illustrated at a lower level in order to differentiate it from the other signals in the graph. The PWM signal is described as having two possible states, "high" and "low". These correspond to "0" and "1" logic signals, or "+1" and "−1" arithmetic signals. Note also that, in practice, the output of the loop filter 14 would vary far more slowly than indicated in the graph.

Initially, the output of the loop filter 200 is greater than the carrier signal 202 and thus the output of the PWM modulator 204 is high. At some point within the first switching period, the carrier signal 202 reaches an amplitude which is greater than the output of the loop filter 200 and the PWM modulator output 204 reverts to a low level. Because the PWM modulator 16 has a finite, albeit high, sampling frequency, the switch to a low logic output occurs at a time which is after the true point of intersection between the carrier signal and the loop filter output, if they were reconstructed as continuous-time signals based on available samples. This introduces a source of noise to the PWM signal and, in order to generate a higher quality output signal, the sampling frequency of the PWM modulator $f_w$ should be as high as possible.

In order to operate correctly, the noise-shaping loop 18 must also be clocked at the same high frequency $f_w$ as the PWM modulator 16. This means that the add/subtract unit 12 as well as the potentially significant amount of arithmetic logic (e.g. integrators, multipliers, etc) in the loop 18 and the loop filter 14 must all be clocked at $f_w$. From a practical perspective this is likely to cause difficulties in synchronizing the hardware correctly, and of course results in higher power consumption generally.

Further, high quality digital audio sources are now available in the form of Super Audio CDs, where the signal is stored in a format known as Direct Stream Digital (DSD), based on pulse-density-modulated (PDM) signals. To drive an external class-D amplifier, this PDM data source must be converted to PWM data.

SUMMARY OF INVENTION

According to a first aspect of the present invention, there is provided a signal converter, comprising: an input configured to receive a pulse-density-modulated (PDM) signal; an output for outputting a pulse-width-modulated (PWM) signal; a noise-shaping loop architecture coupled between the input and the output; and a modulator for generating the PWM signal based on the filtered signal and a carrier signal.

According to a second aspect of the present invention, there is provided a method of generating a pulse-width-modulated (PWM) signal, comprising: receiving, at an input, a pulse-density-modulated (PDM) signal; outputting, at an output, a pulse-width-modulated (PWM) signal; generating a filtered signal using a noise-shaping loop architecture coupled between the input and the output; and generating the PWM signal based on the filtered signal and a carrier signal.

BRIEF DESCRIPTION OF THE DRAWINGS

For a better understanding of the present invention, and to show more clearly how it may be carried into effect, reference will now be made, by way of example, to the following drawings, in which.

DETAILED DESCRIPTION

Figure 3A:
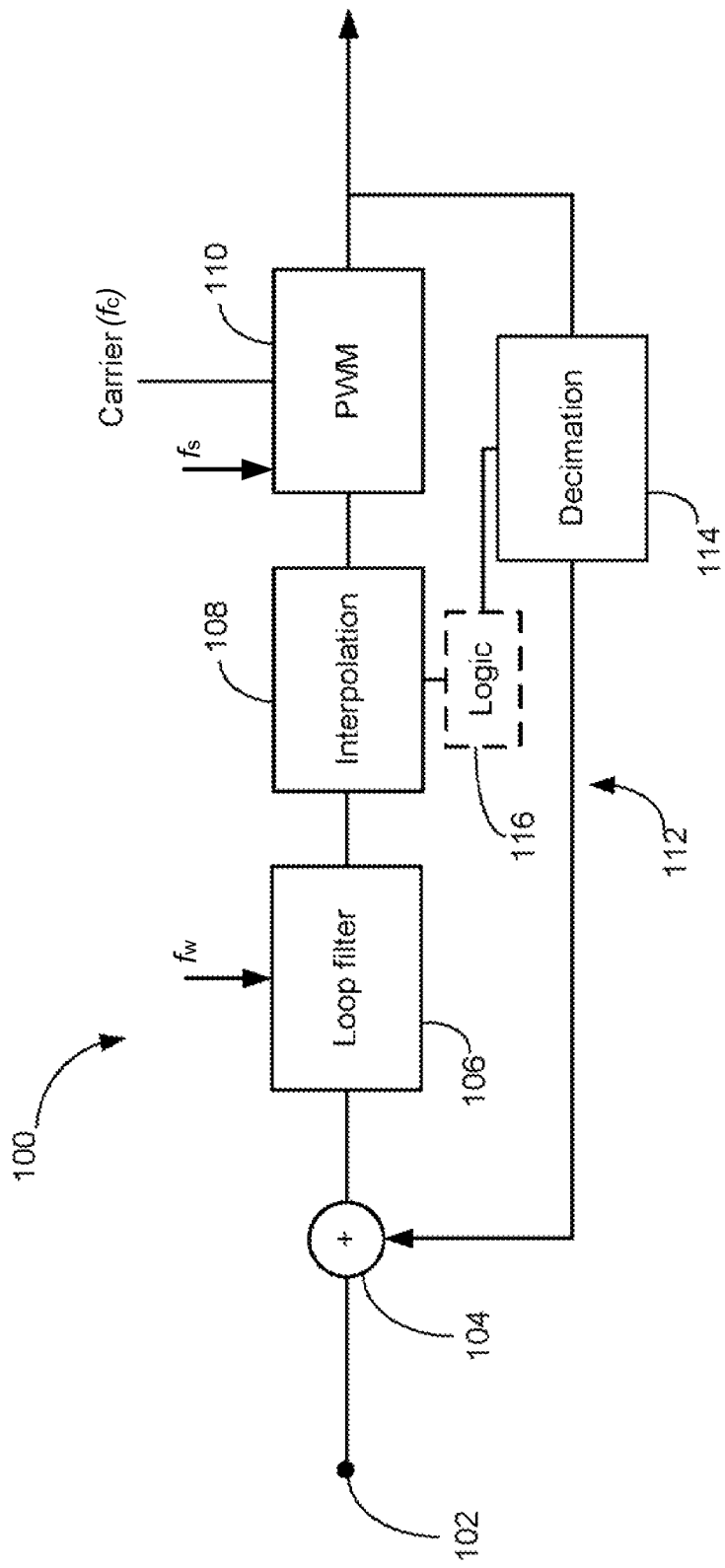
FIG. 3A shows a device for generating PWM signals according to embodiments of the invention.

FIG. 3A shows a device 100 for converting an input pulse-density modulated (PDM) signal X into a PWM signal Y according to embodiments of the invention.

The device 100 comprises an input 102 for receiving a PDM signal X to be converted into a pulse-width-modulated (PWM) output signal Y. The input signal X may comprise any number of bits, but in one embodiment comprises a single bit.

The input signal X is coupled to one or more add/subtract units 104, where it is combined with a feedback signal from a noise-shaping loop 112. The output of the add/subtract unit 104 is coupled to a loop filter 106, which filters the signal and generates an output filtered signal. The feedback signal may have a greater number of bits than the input signal X, such that the outputs of the add/subtract units 104 and the loop filter 106 will also have an increased number of bits than the input signal X. In one example, the outputs of the add/subtract units 104 and the loop filter 106 each have 24 bits.

Those skilled in the art will appreciate that the illustration of FIG. 3A is a schematic one, and the add/subtract unit 104, the loop filter 106 and the noise-shaping loop 112 may be designed so as to achieve a desired signal transfer function and a desired noise transfer function. According to an embodiment of the invention, the noise-shaping loop architecture represented by the add/subtract unit 104, the loop filter 106 and the noise-shaping loop 112 is arranged so as to provide a low-pass effect in the signal transfer function of the device 100. In this way, high-frequency noise is removed from the (low-bit) input signal X. In further embodiments, the noise-shaping loop architecture represented by the add/subtract unit 104, the loop filter 106 and the noise-shaping loop 112 may be arranged so as to provide a high-pass effect in the noise transfer function of the device 100. In this way, noise may be pushed to higher frequencies, above those frequencies humans can perceive.

Figure 3B:
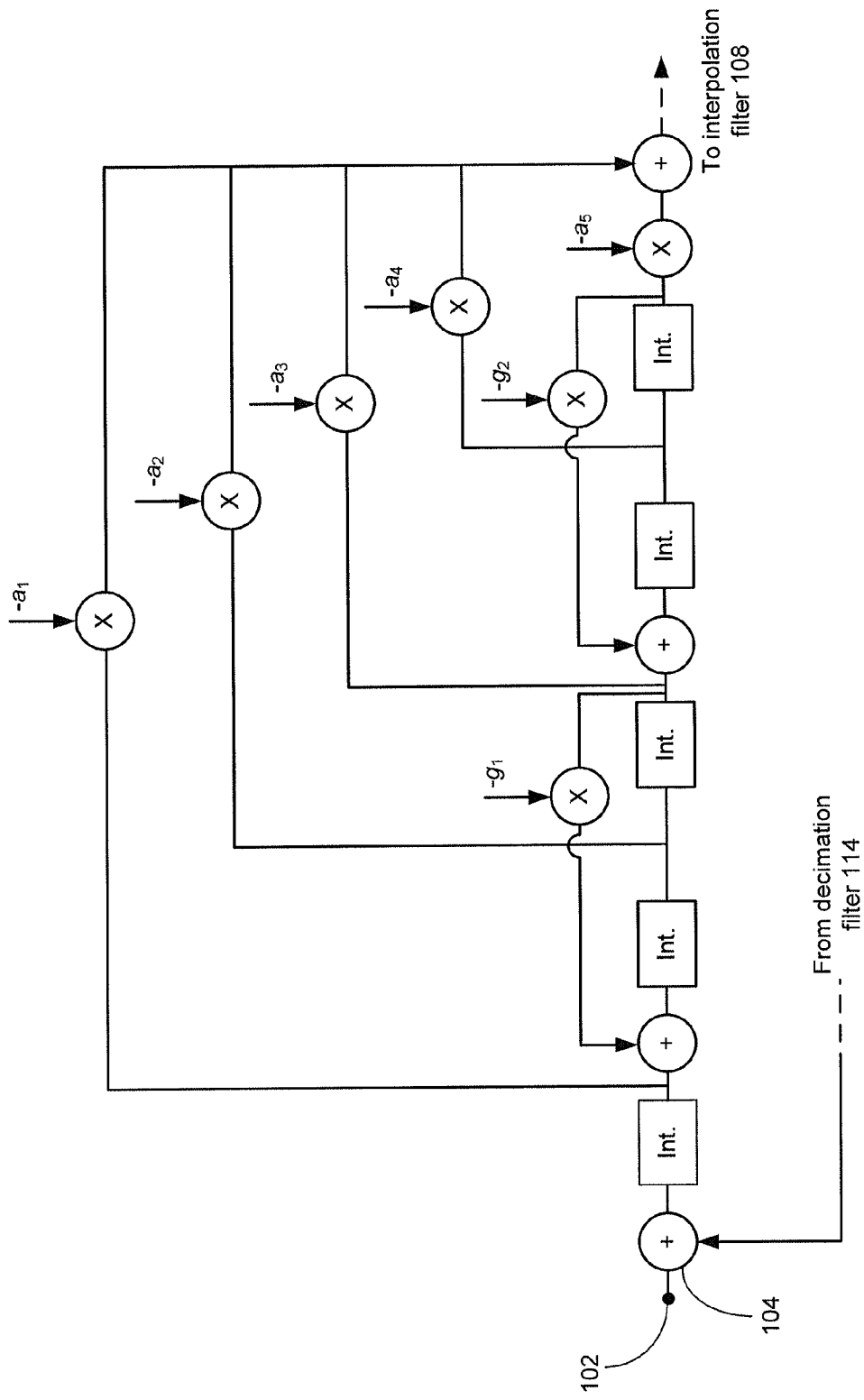
FIG. 3B shows an example of a loop filter according to embodiments of the invention.

Within those constraints, the precise components and configuration of the loop filter 106 are a matter for the designer of the device 100 and are dependent on the nature of the input signal and the desired nature of the output signal. For example, the loop filter 106 may comprise one or several integrators arranged in one or several stages (and thus the loop filter 106 may be first or higher order). The loop filter 106 may have a feedback or a feedforward topology. Further, the noise-shaping loop 112 may be coupled to more than one add/subtract unit prior to, within, or after the loop filter 106. The invention is not limited to any particular arrangement of the loop filter 106 and the noise-shaping loop 112. However, one example is given below in FIG. 3B.

In this example, the loop filter 106 comprises five integrators, and a plurality of respective feedforward loops coupled between the outputs of the integrators and an add/subtract unit at the output of the filter 106. The loop filter 106 also comprises two feedback loops. The feedforward and feedback loops each comprise respective multipliers for multiplying the feedback and feedforward values by respective filter coefficients. Methods of designing filter coefficients are known to those skilled in the art. Overall, the loop filter has a noise transfer function with a high-pass filter effect, and a signal transfer function which has a low-pass filter effect. Those skilled in the art will appreciate that many different circuits can be used to achieve these functions, and the present invention is not limited to the embodiment illustrated in FIG. 3B.

According to embodiments of the invention, the add/subtract unit 104 and loop filter 106 are clocked at a frequency $f_s$. Accordingly, a signal is output from the loop filter 106 every period $1/f_s$.

The output of the loop filter 106 is provided to an interpolation stage 108 (also termed "interpolator" or "interpolating filter"). The interpolation stage 108 acts effectively to increase the frequency of the signal by interpolating values between the actual output values of the loop filter 106. Various methods of interpolation will be known to those skilled in the art. For example, the interpolation stage 108 may interpolate linearly between consecutive output signals of the loop filter 106. In another example, the interpolation stage 108 may be implemented as a sample-and-hold device. That is, in that embodiment, following the output of a sample $x_n$ from the loop filter 106, the interpolation stage 108 outputs samples equal to $x_n$ until a next sample $x_{n+1}$ is output from the loop filter 106.

A pulse-width modulator (PWM modulator) 110 receives the interpolated signal from the interpolation stage 108 as well as a carrier signal from another source (not illustrated), and generates a PWM signal in dependence on those two inputs. The carrier signal has a frequency $f_c$. Various carrier signals will be familiar to those skilled in the art, and the invention is not limited to any one of them. For example, the carrier signal may comprise a saw-tooth waveform (in which the signal increases linearly from an initial low value at the start of a switching period to a high value at the end of the switching period, or vice versa), or a triangular waveform (in which the signal increases linearly from an initial low value at the start of a switching period to a high value at the middle of the switching period, and then decreases linearly from the high value to the low value at the end of the switching period, or vice versa).

Many arrangements are possible for the PWM modulator 110, as would be appreciated by those skilled in the art. Pulse width modulation is a well-known technique and various modulators can be employed to modulate a carrier signal with an information signal to generate PWM signals. For ease of understanding, in the description that follows the PWM modulator 110 is described as a single comparator, arranged to compare the interpolated signal with the carrier signal and output a signal in dependence on the comparison. For example, if the interpolated signal is higher than the carrier signal, the PWM modulator 110 may output a "high" signal; if the interpolated signal is lower than the carrier signal, the PWM modulator 110 may output a "low" signal. In order for the system not to have a DC bias, these signals may correspond to "+1" and "−1" respectively.

The PWM signal is thus characterized, in an embodiment of the invention, by single pulses of variable width within each switching period $1/f_c$ of the carrier signal. The PWM signal will have at most two edges in each switching period.

In order to achieve a high quality of output signal, the PWM modulator 110 must be clocked at a high frequency relative to the carrier signal, in order to compare the interpolated signal with the carrier signal as many times as possible during a single switching period of the carrier signal, and to reflect accurately the phase at which the interpolated signal intersects the carrier signal. Accordingly the PWM modulator 110 is clocked at a frequency $f_w$, which is significantly higher than the carrier signal frequency $f_c$. For example, as noted above, in typical audio applications, $f_w$ may be 40 MHz or higher while the frequency of the carrier signal $f_c$ may be 200 kHz or higher.

In some embodiments, the interpolation filter 108 is also clocked at $f_w$ in order to provide input signals to the PWM modulator 110 at the correct sampling frequency. In those embodiments, therefore, the interpolation stage 108 is controlled to increase the sampling frequency of the signal received from the loop filter 106 (at frequency $f_s$) to $f_w$. In other embodiments, for example where the interpolation stage 108 comprises a sample-and-hold device, the interpolation stage 108 can be clocked at the lower frequency $f_s$. In these embodiments, the PWM modulator 110 is clocked to access the register in which the sample signal is held at a frequency $f_w$. The interpolation stage 108 therefore need only update its output at the same rate as the loop filter 106 generates a filtered signal, i.e. at a sampling frequency $f_s$.

The PWM signal is output from the PWM modulator 110 and from the device 100 generally as an output signal. In some embodiments, the PWM signal may have only a single bit.

A noise-shaping loop 112 is provided in order to shape noise generated by the quantization of the input signal X from a high number of bits to a reduced number of bits, and the quantization of the phase introduced at the PWM modulator 110 (due to the finite frequency $f_w$). The loop is coupled at one end to the output of the PWM modulator 110, and thus receives the PWM signal as an input.

A decimation stage (also called a decimator or decimation filter) 114 is provided in the noise-shaping loop 112 in order to reduce the sampling frequency of the PWM signal from the high sampling frequency $f_w$ of the PWM modulator 110, to the lower sampling frequency $f_s$ of the loop filter 106, etc. Those skilled in the art will appreciate that many different configurations can be employed to achieve this. For example, the decimation stage 114 may comprise a low-pass filter which acts to average the PWM signal over a relatively long window, and a sampler arranged to sample the low-pass filtered signal at the sampling frequency $f_s$, which is lower than the sampling frequency $f_w$. In some embodiments, the decimation stage 114 is clocked at the higher frequency $f_w$ in order to account for the varying PWM signal. In other embodiments, however, the decimation stage 114 may be clocked at the lower frequency $f_s$.

The noise-shaping loop 112 is coupled at its other end to the one or more add/subtract units 104, such that the output of the decimation stage 114 is subtracted from the input signal X. Those skilled in the art will appreciate, as set out above, that the noise-shaping loop may in practice be coupled to one or multiple places in the processing chain, and that the output of the decimation stage 114 and/or the output of the PWM modulator 110 may be multiplied by one or more coefficients in order to precisely tune the noise-shaping effect of the loop 112.

The invention thus provides a device 100 for generating PWM signals in which the PWM modulator is clocked at a high frequency $f_w$ while other components of the device are clocked at a lower frequency $f_s$. By providing interpolation and decimation stages, the high frequency of the PWM modulator 110 can be reduced to allow other components (notably the loop filter and any add/subtract units coupling the noise-shaping loop to the processing chain) to operate at a lower frequency. Thus power consumption in the device 100 is reduced compared with conventional PWM converters, where the entire device is clocked at a single, high frequency.

Figure 1:
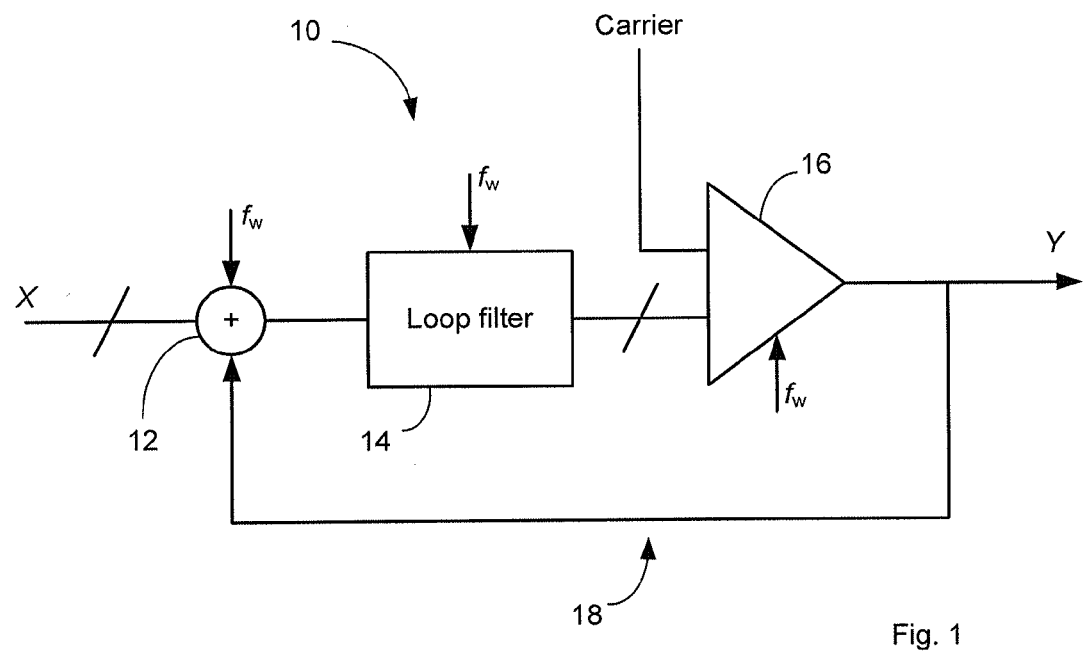
FIG. 1 shows a device for generating PWM signals.
Figure 2:
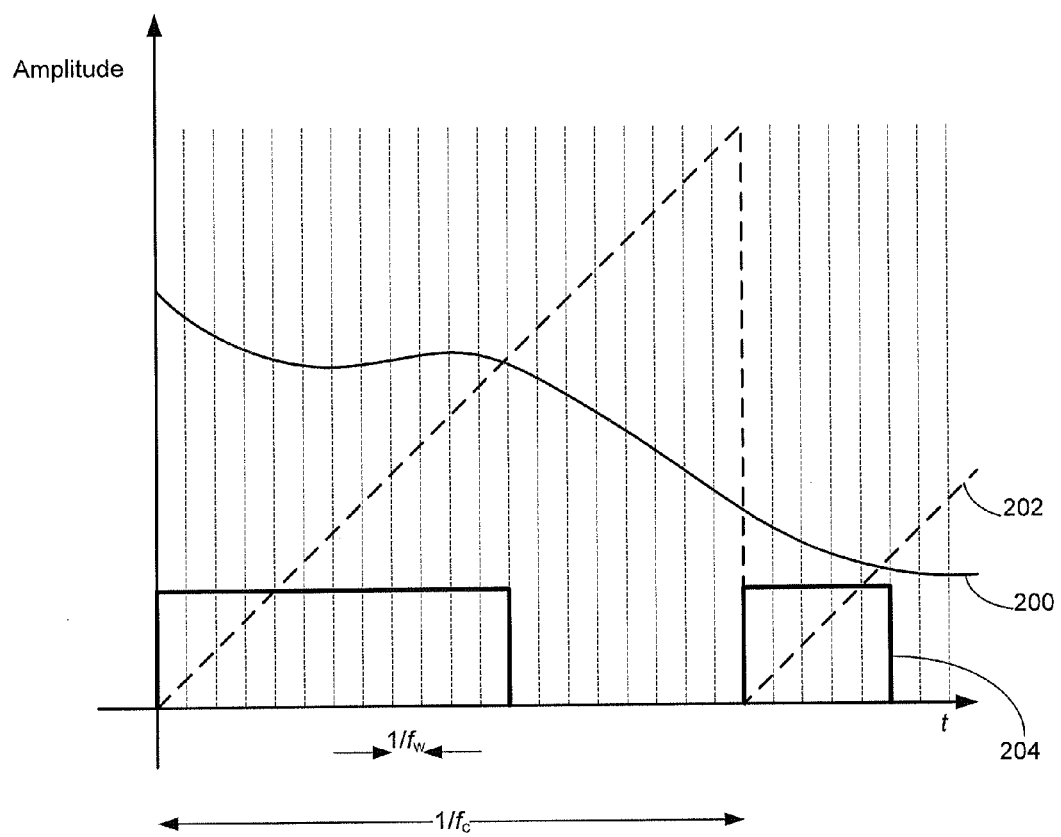
FIG. 2 is a schematic graph showing the various signals within and generated by the device shown in FIG. 1.

The frequencies $f_w$ (the clocking frequency of the PWM modulator 110), $f_c$ (the frequency of the PWM carrier signal) and $f_s$ (the clock frequency of the loop filter 106, etc) are independent of each other and may be set according to system requirements, within the following general rules. $f_w$ is set relatively high compared to the other two frequencies, and is in practice set as high as possible for the reasons set out above with respect to FIG. 2. The higher the frequency, the higher quality of output in the PWM signal.

The frequency of the carrier signal $f_c$ is set according to the requirements for the PWM signal. In general $f_c$ is the lowest frequency of the three frequencies.

The frequency of the noise-shaping loop 112 and the loop filter 106, $f_s$, is set between the other two frequencies such that $f_c \le f_s < f_w \cdot f_s$ must be lower than $f_w$ in order to benefit from the advantages of the invention; that is, reduced power consumption and reduced difficulties in synchronizing the components of the device 100. $f_s$ must in practice be at least as great as $f_c$ in order for the noise-shaping loop 112 to provide effective noise shaping, i.e. feeding back information on the position and width of the pulse in the PWM signal for each switching cycle. In practice, the precise level of $f_s$ may be set based on a convenient clock signal available in the device 100 within the limits described above.

The interpolation 108 and decimation filters 114 typically each introduce a delay which is generally undesirable as it can jeopardize the stability of the noise-shaping loop 112, i.e. the greater the delay between the PWM signal output and the input signal X at the add/subtract unit 104, the greater the risk that the feedback signal will not reduce noise but increase it.

Delay in the interpolation stage 108 can be mitigated by selecting the method of interpolation appropriately. The more complicated the interpolation scheme (i.e. the higher the order of interpolation) is, the longer the delay will be. For example, in one embodiment, the interpolation stage 108 may implement a linear interpolation between consecutive values of the signal received at the interpolation stage 108, as this introduces relatively little delay because the stage 108 need only wait one cycle $1/f_s$ before being able to perform its calculations. However, even this scheme introduces a delay of at least $1/f_s$. In another embodiment, the interpolation stage 108 is implemented as a sample-and-hold device, as in this case no delay is introduced. The sample-and-hold device can also introduce relatively little noise if the sampling frequency (i.e. $f_s$) is relatively high (i.e. greater than $f_c$ but lower than $f_w$). Further, the noise-shaping loop 112 will compensate for any noise which is introduced.

The decimation stage 114 inevitably introduces some delay, as each sample of its output is required to represent multiple samples of the PWM signal output (because it is clocked at the lower frequency $f_s$). However, even in this case the delay may be reduced. In embodiments where the interpolation stage 108 is implemented as a sample-and-hold device, the decimation stage 114 may be implemented with a look-up table (LUT). Operation of this embodiment will be described below.

The sample-and-hold device holds one input to the PWM modulator 110 at a constant level for each period defined by the $f_s$ frequency. As the variation of the carrier signal over that period is also known (i.e. its amplitude and gradient are known values), it is possible to determine at the beginning of each $1/f_s$ cycle whether or not the two signals will intersect and, if so, at what phase the two signals will intersect. Phase may be counted in terms of the number of $1/f_w$ clock cycles since the beginning of the current $1/f_s$ cycle. In this sense, it is possible to predict the PWM output signal in advance.

If the PWM output signal is known in advance, the input to the decimation filter 114 is also known in advance (as they are the same signal). The response of a low-pass filter to a given PWM signal can thus be recorded and stored in a LUT, and the decimation filter 114 can output the stored response once the presence and/or phase of the intersection of the carrier signal with the sample held in the interpolation filter 108 is known. Logic circuitry 116 in communication with the interpolation filter 108 and the decimation filter 114 can be provided to implement this.

In one embodiment, therefore, the decimation filter 114 comprises a LUT, in which the response of a low-pass filter to a step change in the PWM signal is recorded. The response may be recorded over one or multiple $1/f_s$ cycles so that, in the latter case, the output of the decimation filter 114 can be provided over multiple such cycles.

The LUT may further store the step response of a low-pass filter according to the phase of the intersection between the carrier signal and the held sample. That is, for each value of the phase at which the intersection occurs, or is predicted to occur (where the phase may be counted by the number of $1/f_w$ clock cycles since the beginning of the current $1/f_s$ cycle), the LUT may store the response of a low-pass filter over one or multiple $1/f_s$ clock cycles. Once the intersection and the phase of the intersection is known, the decimation filter 114 can be controlled to output the values from the LUT corresponding to the given phase.

Figure 4:
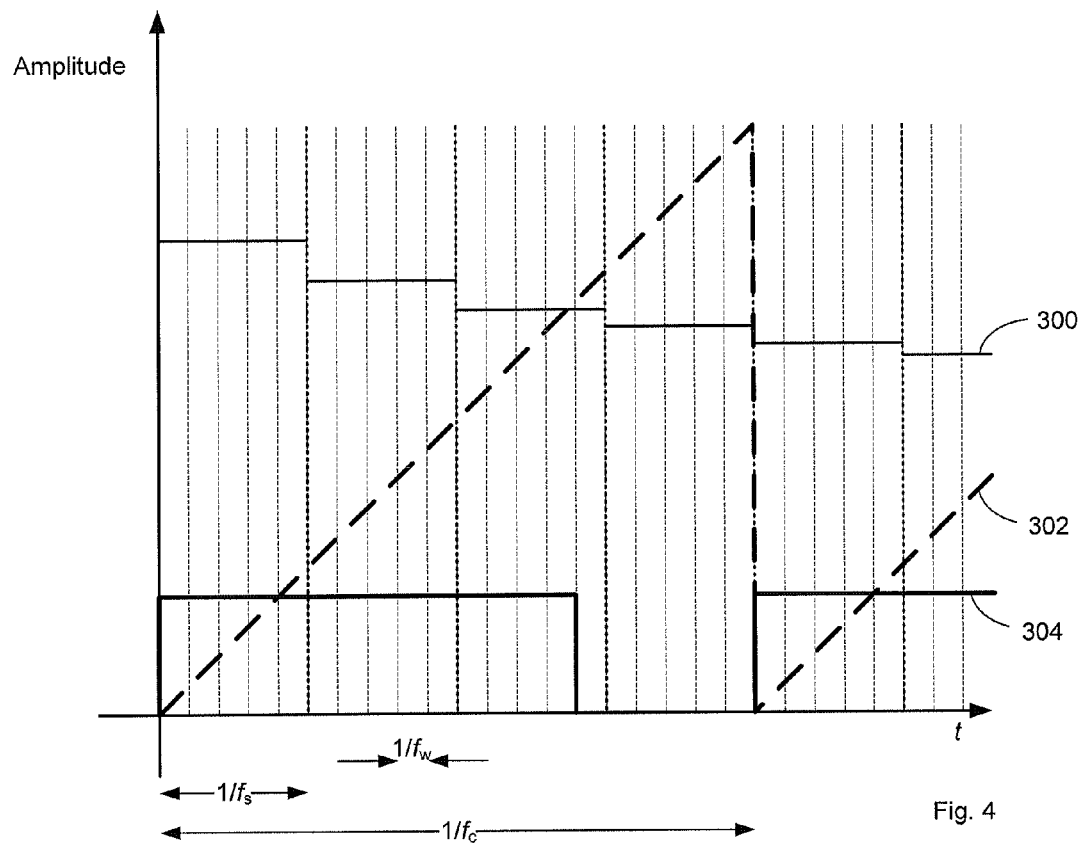
FIG. 4 is a schematic graph showing the various signals within and generated by the device of FIG. 3A, according to embodiments of the invention.

FIG. 4 is a schematic graph showing an example of the waveforms in the device 100, when the interpolation filter 108 is implemented as a sample-and-hold device. The various signals have the same form as in FIG. 2, with the output of the interpolation filter 108 illustrated as a solid line 300, the carrier signal illustrated as a thick dashed line 302 (following a rising sawtooth pattern), and the PWM signal illustrated as a solid line 304. Also illustrated are the sampling points of the PWM modulator 110 as vertical dashed lines, and the clocking frequency of the interpolating filter 108 as vertical dotted lines.

In this illustration, the PWM modulator 110 is clocked at a frequency which is 20 times greater than the carrier frequency $f_c$, and five times greater than the frequency of the sample-and-hold device 108, $f_s$. These relative frequencies are chosen for ease of illustration, rather than being practical examples. In practice, the frequencies may differ by orders of magnitude.

For each period $1/f_s$, the sample-and-hold device 108 generates a new sampled value of the signal output from the loop filter 106. Throughout the first two such periods, the sampled value is higher than the carrier signal, and thus the output of the PWM signal is high. In the third period, the output of the sample-and-hold device 300 and the carrier signal 302 intersect. Further, the logic circuitry 116 can determine at the start of the period $1/f_s$ that those two signals will intersect. The logic circuitry 116 may also be able to determine the phase of intersection. That is, in the example of FIG. 4, the logic circuitry 116 may be able to determine that the output of the sample-and-hold device 300 and the carrier signal 302 will intersect after four sampling periods $1/f_w$ of the PWM modulator 110. It can then control the decimation filter 114 to output values from the LUT in dependence on the phase of the intersection.

Figure 5:
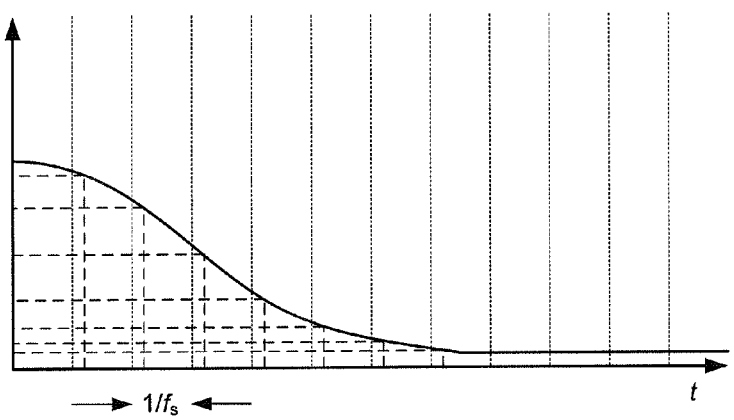
FIG. 5 shows step responses of a filter.

This concept can be followed in further detail with reference to FIG. 5, which shows an example step response of the decimation filter 114 to a falling edge, when the PWM output signal steps from +1 to −1, and when the decimation filter 114 comprises a low-pass filter. The vertical dotted lines illustrate the sampling frequency $f_s$ of the decimation filter (i.e. the frequency with which the decimation filter outputs values).

In the example of FIG. 4, the intersection between the carrier signal and the output of the sample-and-hold device occurs after four of the five $1/f_w$ periods in the $1/f_s$ cycle. At the start of the next $1/f_s$ cycle, the (falling) step response of the decimation filter 114 will have progressed by one $1/f_w$ cycle. The logic circuitry 116 can thus control the decimation filter 114 to output a value corresponding to the sampled step response of the filter delayed by one $1/f_w$ cycle (stored in the LUT, for example). At the next $1/f_s$ cycle, the logic circuitry 116 can control the decimation filter to output a value corresponding to the sampled step response of the filter delayed by six $1/f_w$ cycles, and so on for a number of $1/f_s$ cycles until the step response has reached a steady state. In this way, the decimation filter 114 can also be clocked at the lower frequency $f_s$.

It may happen that the input signal is particularly close to a maximum or minimum value, such that the pulse width for a given switching cycle is extremely long or extremely short. In these circumstances, two steps in the PWM signal may occur close together (always in opposite directions), such that the response of the decimation filter 114 is affected by both steps. In order to account for this, in some embodiments the logic circuitry 116 can take account of both steps for example by combining the responses from both steps together. According to one embodiment, the responses may be combined by subtracting one response from the other.

Thus, in the example of FIG. 4, there is a rising edge six $1/f_w$ cycles after the falling edge discussed above. In the first $1/f_s$ cycle after the falling edge, the logic circuitry 116 controls the decimation filter to output a value corresponding to the falling step response of the filter sampled at one $1/f_w$ cycle. At the next $1/f_s$ cycle, the decimation filter must take account of the falling edge six $1/f_w$ cycles previously, but also the rising edge which occurs at the $f_s$ sampling point (i.e. without any delay for that $1/f_s$ cycle). In this case, the logic circuitry 116 may control the decimation filter to output a value corresponding to the falling step response of the filter sampled at six $1/f_w$ cycles, less the rising step response of the filter sampled at 0 $1/f_w$ cycles. This approach can be repeated for subsequent $1/f_s$ cycles (i.e. for the next $1/f_s$ cycle, the falling step response at 11 $1/f_w$ cycles, less the rising step response at 5 $1/f_w$ cycles, etc).

The invention thus provides a signal converter which directly converts pulse-density-modulated (PDM) signals into pulse-width-modulated (PWM) signals. In embodiments, a noise-shaping loop architecture can be configured to apply a signal transfer function having a low-pass filter effect, and a noise transfer function having a high-pass filter effect. In further embodiments decimation and interpolation can ensure that the noise-shaping loop architecture operates at a first sampling frequency, while the PWM modulator operates at a second, higher sampling frequency.

Those skilled in the art will appreciate that various amendments and alterations can be made to the embodiments described above without departing from the scope of the invention as defined in the claims appended hereto.

The invention claimed is:

1. A signal converter, comprising:
   an input configured to receive a pulse-density-modulated (PDM) signal at a first sampling frequency;
   an output for outputting a pulse-width-modulated (PWM) signal at a second sampling frequency;
   an add/subtract unit for producing a difference signal by subtracting a feedback signal from the PDM signal;
   a loop filter for filtering the difference signal to produce a filtered signal;
   an interpolation filter for generating an interpolated signal by interpolating the filtered signal from the first sampling frequency to the second sampling frequency;
   a modulator for generating the PWM signal based on the interpolated signal and a carrier signal; and
   a decimation filter for producing the feedback signal as a decimated representation of the PWM signal.

2. The signal converter according to claim 1, wherein a signal transfer function of the signal converter has a low-pass filter effect.

3. The signal converter according to claim 1, wherein a noise-transfer function of the signal converter has a high-pass effect.

4. The signal converter according to claim 1, wherein the second sampling frequency is greater than the first sampling frequency.

5. The signal converter according to claim 1, wherein the interpolation filter comprises a sample-and-hold device.

6. The signal converter according to claim 5, wherein the sample-and-hold device is clocked at the first sampling frequency.

7. The signal converter according to claim 5, further comprising logic circuitry coupled to the interpolation filter and the decimation filter, configured to determine whether the interpolated signal and the carrier signal will intersect in a next clock period of the sample-and-hold device, and to control the decimation filter to output a value based on said determination.

8. The signal converter according to claim 7, wherein the logic circuitry is further configured to determine, if the interpolated signal and the carrier signal intersect in the next clock period of the sample-and-hold device, a phase of the intersection of the interpolated signal with the carrier signal, and to control the decimation filter to output a value based on said determined phase.

9. The signal converter according to claim 8, wherein the phase of the intersection is expressed as an integer number of clock periods at the second sampling frequency.

10. The signal converter according to claim 8, wherein the decimation filter comprises a look-up table storing one or more step responses.

11. The signal converter according to claim 8, wherein the decimation filter is clocked at the first sampling frequency.

12. The signal converter according to claim 1, wherein the decimation filter comprises a low-pass filter and a sampler.

13. The signal converter according to claim 1, wherein the decimation filter comprises a look-up table with a plurality of stored step responses.

14. The signal converter according to claim 1, wherein the carrier signal has a third frequency which is lower than the first sampling frequency.

15. The signal converter according to claim 1, wherein the modulator comprises a comparator for comparing the interpolated signal with the carrier signal and supplying a signal indicative of the comparison as the PWM signal.

16. The signal converter according to claim 1, wherein the PWM signal is a binary signal.

17. The signal converter according to claim 1, wherein the carrier signal is a sawtooth signal or a triangle-wave signal.

18. A method of generating a pulse-width-modulated (PWM) signal at a second sampling frequency from a pulse-density-modulated (PDM) signal at a first sampling frequency, the method comprising:
    subtracting a feedback signal from the PDM signal to produce a difference signal;
    filtering the difference signal to produce a filtered signal;
    interpolating the filtered signal from the first sampling frequency to the second sampling frequency;
    generating the PWM signal based on the interpolated signal and a carrier signal; and
    producing the feedback signal as a decimated representation of the PWM signal.

19. The method according to claim 18, wherein the method applies a signal transfer function having a low-pass filter effect.

20. The method according to claim 18, wherein the method applies a noise-transfer function having a high-pass filter effect.

21. The method according to claim 18,
    wherein the second sampling frequency is greater than the first sampling frequency.

* * * * *